(12) United States Patent  
Gambino et al.

(10) Patent No.: US 8,450,168 B2  
(45) Date of Patent: May 28, 2013

(54) FERRO-ELECTRIC CAPACITOR MODULES, METHODS OF MANUFACTURE AND DESIGN STRUCTURES

(75) Inventors: Jeffrey P. Gambino, Westford, VT (US); Matthew D. Moon, Jeffersonville, VT (US); William J. Murphy, North Ferrisburgh, VT (US); James S. Nakos, Essex Junction, VT (US); Paul W. Pastel, Essex Junction, VT (US); Brett A. Philips, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 12/823,728

(22) Filed: Jun. 25, 2010

(65) Prior Publication Data

US 2011/0316058 A1     Dec. 29, 2011

(51) Int. Cl.  
*H01L 21/8238*     (2006.01)  
*H01L 29/76*       (2006.01)

(52) U.S. Cl.  
USPC .... 438/210; 438/238; 257/295; 257/E27.104; 257/E21.664

(58) Field of Classification Search  
USPC .......... 438/199, 210, 238, 239, 622; 257/274, 257/295, 369, E27.104, E21.664  
See application file for complete search history.

(56) References Cited

U.S. PATENT DOCUMENTS

| | | | |
|---|---|---|---|
| 6,130,102 A | 10/2000 | White, Jr. et al. | |
| 6,506,643 B1 | 1/2003 | Hsu et al. | |
| 6,511,856 B2 | 1/2003 | Van Buskirk et al. | |
| 6,734,477 B2 | 5/2004 | Moise et al. | |
| 7,339,347 B2 * | 3/2008 | Elder et al. | 320/104 |
| 7,348,617 B2 | 3/2008 | Kumura et al. | |
| 7,518,173 B2 * | 4/2009 | Hikosaka et al. | 257/295 |
| 2004/0084701 A1 | 5/2004 | Kanaya et al. | |
| 2004/0166596 A1 * | 8/2004 | Sashida et al. | 438/3 |
| 2006/0001026 A1 * | 1/2006 | Sashida | 257/69 |
| 2006/0175642 A1 * | 8/2006 | Dote et al. | 257/295 |
| 2008/0073685 A1 | 3/2008 | Wang | |
| 2008/0121958 A1 * | 5/2008 | Izumi | 257/295 |
| 2008/0164503 A1 | 7/2008 | Choi et al. | |
| 2009/0020797 A1 | 1/2009 | Wang | |
| 2009/0280577 A1 * | 11/2009 | Takamatsu et al. | 438/3 |
| 2010/0255675 A1 * | 10/2010 | Kikuchi et al. | 438/637 |
| 2011/0210424 A1 | 9/2011 | Wang | |
| 2011/0217792 A1 | 9/2011 | Wang | |

FOREIGN PATENT DOCUMENTS

EP     1887624 A1     2/2008

OTHER PUBLICATIONS

Lung et al., "Modularized Low Temperature . . . for Advanced SOC(ASOC) Application", IEEE 2002 Custom Integrated Circuits Conference, pp. 479-482.

International Search Report for Application No. PCT/US2011/041546 dated Dec. 23, 2011.

* cited by examiner

*Primary Examiner* — Hsien Ming Lee  
(74) *Attorney, Agent, or Firm* — Michael J. Le Strange; Roberts Mlotkowski Safran & Cole, P.C.

(57) ABSTRACT

Ferro-electric capacitor modules, methods of manufacture and design structures. The method of manufacturing the ferro-electric capacitor includes forming a barrier layer on an insulator layer of a CMOS structure. The method further includes forming a top plate and a bottom plate over the barrier layer. The method further includes forming a ferro-electric material between the top plate and the bottom plate. The method further includes encapsulating the barrier layer, top plate, bottom plate and ferro-electric material with an encapsulating material. The method further includes forming contacts to the top plate and bottom plate, through the encapsulating material. At least the contact to the top plate and a contact to a diffusion of the CMOS structure are in electrical connection through a common wire.

15 Claims, 11 Drawing Sheets

FERRO-ELECTRIC CAPACITOR MODULES, METHODS OF MANUFACTURE AND DESIGN STRUCTURES

FIELD OF THE INVENTION

The invention relates to semiconductor devices and methods of manufacture and, more particularly, to ferro-electric capacitor modules, methods of manufacture and design structures.

BACKGROUND

A ferro-electric capacitor uses ferroelectric material such as, for example, PZT. Ferro-electric devices are typically used in digital electronics by way of ferro-electric RAM (FRAM). FRAM is a random access memory similar to DRAM but uses a ferro-electric layer instead of a dielectric layer to achieve non-volatility. FRAM is thus an alternative non-volatile memory technology that offers the same functionality as Flash memory. FRAM advantages over Flash include: lower power usage, faster write performance and a much greater maximum number (exceeding $10^{16}$ for 3.3 V devices) of write-erase cycles.

FRAM also has advantages over DRAM. Specifically, in DRAM, the charge deposited on the capacitor plates leaks across the insulating layer and the control transistor, and disappears. In order for a DRAM to store data for anything other than a short time, e.g., less than one second, every cell must be periodically read and then re-written, a process known as refresh. The refresh operation requires a continuous supply of power.

In contrast, FRAM only requires power when actually reading or writing a cell. As such, FRAM does not require a refresh process. FRAM does work similar to DRAM in write operations, but differently in read operations. Specifically, writing is accomplished by applying a field across the ferro-electric layer by charging the plates on either side of the ferro-electric layer, thereby storing a "1" or "0". In the read operation, the transistor forces the cell into a particular state, e.g., "0". If the cell already held a "0", nothing will happen in the output lines; however, if the cell held a "1", the re-orientation of the atoms will cause a brief pulse of current in the output. The presence of this pulse means the cell held a "1". Since this process overwrites the cell, reading FRAM is a destructive process, and requires the cell to be re-written if it was changed.

Currently FRAM cells, though, are not integrated very well into CMOS technologies. Accordingly, there exists a need in the art to overcome the deficiencies and limitations described hereinabove.

SUMMARY

In a first aspect of the invention, a method of manufacturing the ferro-electric capacitor includes forming a barrier layer on an insulator layer of a CMOS structure. The method further includes forming a top plate and a bottom plate over the barrier layer. The method further includes forming a ferro-electric material between the top plate and the bottom plate. The method further includes encapsulating the barrier layer, top plate, bottom plate and ferro-electric material with an encapsulating material. The method further includes forming contacts to the top plate and bottom plate, through the encapsulating material. At least the contact to the top plate and a contact to a diffusion of the CMOS structure are in electrical connection through a common wire.

In another aspect of the invention, a method forming a CMOS structure comprises a gate structure, source and drain regions associated with the gate structure and insulator material over the gate structure. The method further comprises depositing a plurality of layers on the insulator material, the plurality of layers including at least a ferro-electric material sandwiched between a top plate and a bottom plate. The method further comprises encapsulating the plurality of layers in an encapsulating material. The method further comprises forming contacts to the top plate and the bottom plate. At least the contact to the top plate and a contact to the source of the CMOS structure are in electrical connection through a common wire.

In yet another aspect of the invention, a structure comprises a CMOS structure comprising a gate structure, source and drain regions associated with the gate structure, lower insulator material over the gate structure and contacts surrounded by the insulator material and in contact with the source and drain regions. The structure further comprises a plurality of layers on the insulator material. The plurality of layers including at least a ferro-electric material sandwiched between a top plate and a bottom plate. The structure further comprises encapsulating material which encapsulates the plurality of layers. The structure further comprises one or more upper insulator layers formed over the lower insulator layer. The structure further comprises wiring formed in the one or more upper insulator layers, which make contact to the top plate and the bottom plate and the source and drain regions.

In yet another aspect of the invention, a design structure is tangibly embodied in a machine readable storage medium for designing, manufacturing, or testing an integrated circuit. The design structure comprises a CMOS structure comprising an insulator material over a gate structure; a plurality of layers on the insulator material, the plurality of layers including at least a ferro-electric material sandwiched between a top plate and a bottom plate; encapsulating material which encapsulates the plurality of layers; one or more upper insulator layers formed over the lower insulator layer; and wiring formed in the one or more upper insulator layers, which make contact to the top plate and the bottom plate and to a contact of diffusions of the CMOS structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor devices and methods of manufacture and, more particularly, to ferro-electric capacitor modules, methods of manufacture and design structures. More specifically, the present invention is directed to various integration strategies for embedding ferro-electric capacitors into a CMOS flow. The devices of the present invention and methods of manufacture enhance aspect ratios of current ferro-electric capacitors (e.g., ferro-electric random access memory (FRAM)), and present various strategies for providing different capacitors, each advantageously providing a reduced contact aspect ratio to silicon amongst other features.

FIGS. 1-12 show structures and methods of fabricating a device in accordance with aspects of the invention. In the design of this aspect of the invention, the structure has a reduced contact aspect ratio to silicon, and the method of fabrication eliminates hydrogen exposure of the top electrode contact (which may be applicable to all aspects of the invention).

Figure 1:
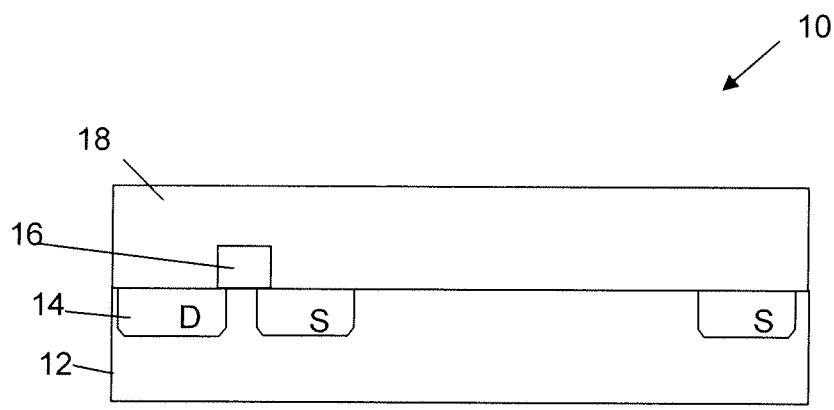
FIGS. 1-12 show structures and methods of fabricating a device in accordance with aspects of the invention.

In particular, FIGS. 1-12 show methods of manufacturing a FRAM using either a dual or single damascene process. FIG. 1 starts with a conventional CMOS structure 10. In particular, source (S) and drain (D) regions 14 are provided in a substrate 12 using conventional doping processes. The substrate 12 can be, for example, silicon. A conventional gate structure 16 is fabricated on the substrate 12 using conventional deposition, lithographic and etching processes. The gate structure 16 spans between the source (S) and drain (D) regions 14, and includes a gate insulator (e.g., dielectric), poly gate body and nitride or oxide sidewalls. In embodiments, the gate structure 16 can also include a capping layer such as, for example, a nitride or oxide cap. An insulator layer 18 is deposited on the substrate 12 and gate structure 16. In embodiments, the insulator layer 18 may be, for example, a BPSG.

Figure 2:
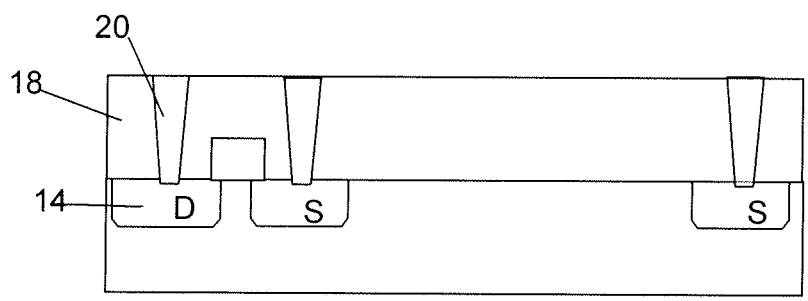

In FIG. 2, contacts 20 are formed in the insulator layer 18. More specifically, using conventional lithographic and etching processes (e.g., reactive ion etching), contact holes are formed in the insulator layer 18. The contact holes extend to the source (S) and drain (D) regions 14. A metal is deposited in the contact holes to form the contacts 20, which contact the source (S) and drain (D) regions 14. In embodiments, the metal is tungsten; although other metals are also contemplated by the invention. In embodiments, tungsten may be deposited using conventional deposition processes. These processes may include lining the contact holes with a barrier layer such as, for example, TiN or TiAlN, prior to the tungsten deposition. After metal deposition, the structure undergoes a polishing using, for example, conventional polishing steps such as chemical mechanical polishing (CMP).

Figure 3:
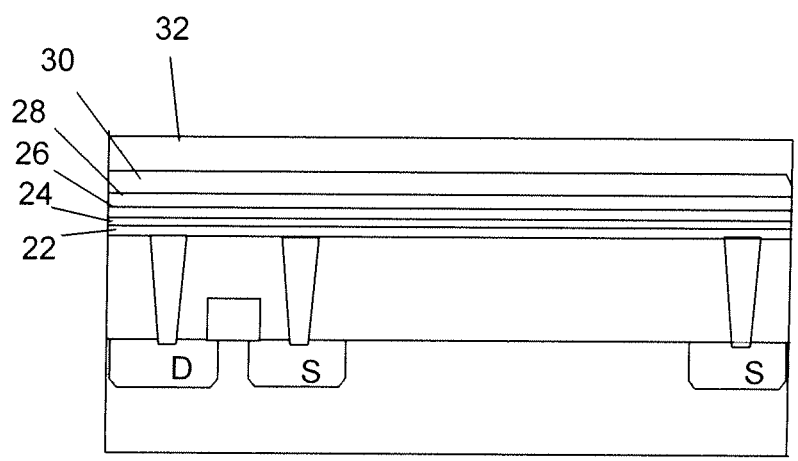

FIG. 3 shows several deposition steps in accordance with aspects of the invention. In particular, an insulator layer 22 is deposited on the insulator layer 18. In embodiments, the insulator layer 22 is TEOS (Tetraethyl orthosilicate); although other insulator materials are contemplated by the invention. The insulator layer 22 can be blanket deposited using, for example, conventional CVD or PVD processes, and can range in thickness from about 10 nm to about 1000 nm. An optional layer 24 of $Al_2O_3$ (AlxOy) is deposited on the insulator layer 22 using, for example, conventional CVD or PVD processes. The layer 24 may be blanket deposited to a depth of about 5 nm to about 50 nm. An optional TiOx layer 26 is blanket deposited on layer 24. The TiOx layer 26 may be deposited to a depth of about 5 nm to about 50 nm using, for example, conventional CVD or PVD processes.

Still referring to FIG. 3, a metal layer (e.g., platinum layer 28) is deposited on the optional TiOx layer 26 using, for example, conventional metal deposition processes. In embodiments, the platinum layer 28 acts as a bottom electrode contact (plate) of a capacitor. The platinum layer 28 may be deposited to a thickness of about 50 nm to about 300 nm.

In further embodiments, a PZT (lead zirconate titanate) layer 30 is deposited on the platinum layer 28 to a thickness of about 50 nm to about 400 nm, using conventional deposition processes. For example, a deposition technique for PZT is metal organic chemical vapor deposition ("MOCVD"); however, other deposition techniques may be used, such as sol-gel or metal organic decomposition. The PZT layer 30 is a ferro-electric, which has a spontaneous electric polarization (electric dipole) that can be reversed in the presence of an electric field. In embodiments, the PZT layer 30 can be heavily doped with Lanthanum, Strontium or Calcium, in the percent range. Of course, other ferro-electric materials are also contemplated by the invention (which is applicable for all aspects of the invention).

An Iridium Oxide (IrOx) layer 32 is blanket deposited on the PZT layer 30 to a thickness of about 50 nm to about 300 nm. In optional embodiments, the layer 32 may be capped with Ir or platinum to a thickness of about 20 nm to about 50 nm. The layer 32 will act as a top electrode contact (plate) for the capacitor.

Figure 4:
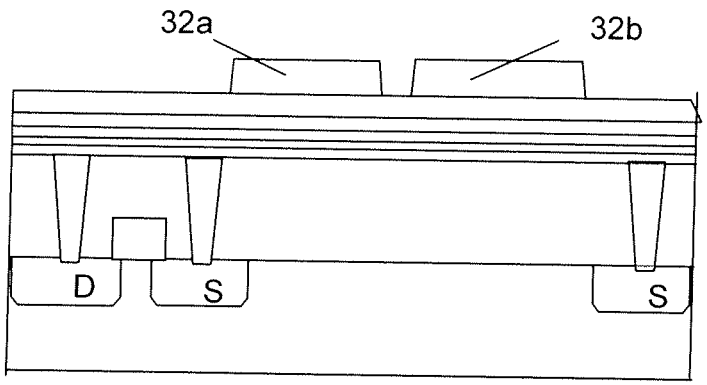

In FIG. 4, the layer 32 is patterned using conventional lithographic and etching processes. For example, a resist is deposited over the layer 32 and exposed to light to form openings. Once the openings are formed, a reactive ion etching process is performed to pattern the layer 32 to form patterns 32a and 32b. The resist is then stripped using, for example, an organic clean and rinse process. The shadowed pattern 32b (on the right of the figure) is a portion of the top plate (layer 32) that is set back with respect to the pattern 32a, in a direction perpendicular to the plane of the structure shown in FIG. 4.

Figure 5:
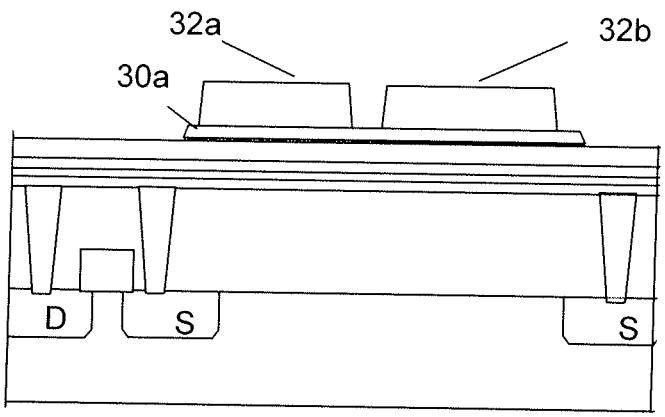

FIG. 5 shows a patterning process of the PZT layer 30. More specifically, in FIG. 5, the PZT layer 30 is patterned to form pattern 30a. In embodiments, the pattern 30a is sandwiched between the top plate and bottom plate of the capacitor and acts as an insulator of the capacitor. In one example, the pattern 30a is formed by depositing a resist (e.g., PZR mask) over the layer 30 and patterns 32a and 32b. The resist will protect the patterns 32a and 32b (top plates) during subsequent etching processes. The resist is exposed to light to form opening(s) and, thereafter, a reactive ion etching (RIE) process is performed to pattern the layer 30 to form pattern 30a. The resist is then stripped using, for example, an organic clean and rinse process.

Figure 6:
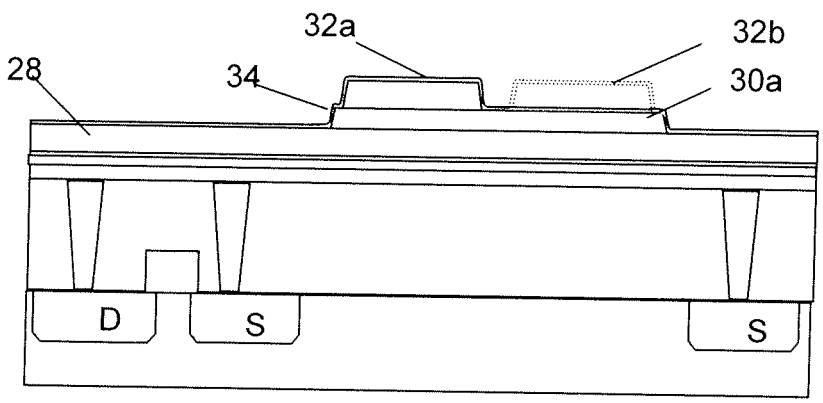

In FIG. 6, an optional layer 34 is deposited on the patterns 32a, 32b and 30a, and layer 28 using conventional deposition processes. In embodiments, the layer 34 is an optional AlOx, which encapsulates the patterns 32a, 32b and 30a. In this manner, the encapsulated patterns 32a, 32b and 30a will be protected from hydrogen poisoning during subsequent processing steps. The layer 34 can be deposited to a thickness up to a depth of about 50 nm.

Figure 7:
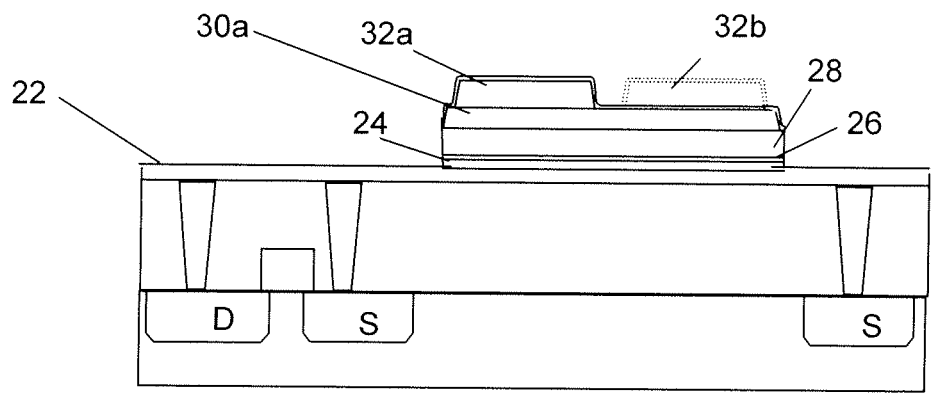

In FIG. 7, the layers 24, 26 and 28 are etched using conventional etching processes such as, for example, RIE. In embodiments, the etching will be selective to layers 24, 26 and 28, and will not significantly affect the underlying layer 22. The etching process can be performed, for example, by depositing a resist (mask) over the encapsulated patterns 32a, 32b and 30a (or optional layer 34). The resist is then exposed to light to form opening(s) and, thereafter, the structure undergoes an etching process to remove unprotected portions of layers 24, 26 and 28 (and optional layer 34). The structure of FIG. 7 can then undergo a conventional cleaning process.

Figure 8:
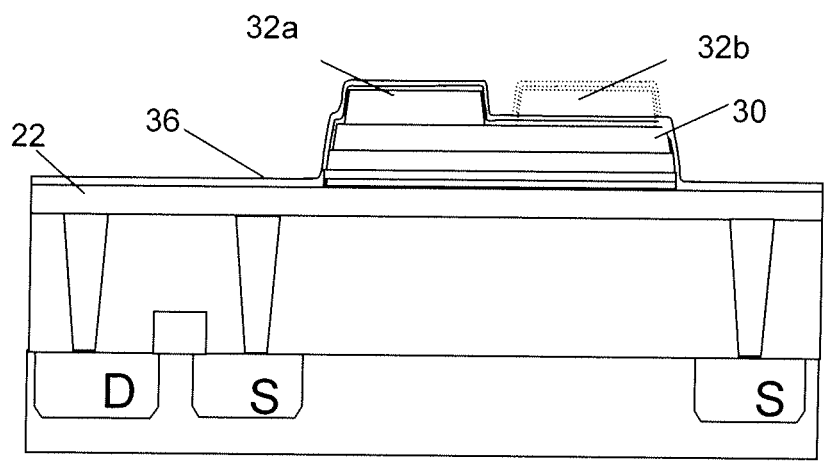

In FIG. 8, the structure is encapsulated by layer 36. More specifically, layer 36 is deposited on the patterns 32a, 32b and 30a (or optional layer 34), and on layer 22. The layer 36 may also be deposited on sidewalls and any exposed surfaces of layers 24, 26 and 28. In this manner, the layer 36 will protect or encapsulate the sidewalls and any exposed surfaces of layers 24, 26 and 28. The layer 36 can be, for example, AlOx, deposited to a thickness of about 50 nm or less. As an option, it is also contemplated by the invention to use a resist masking to cover layers 32a, 32b and 30a, and etch the layer 36 on regions away from the ferro cap regions (as defined, for example, by stacked layers 24, 26, 28 and 30a).

Figure 9:
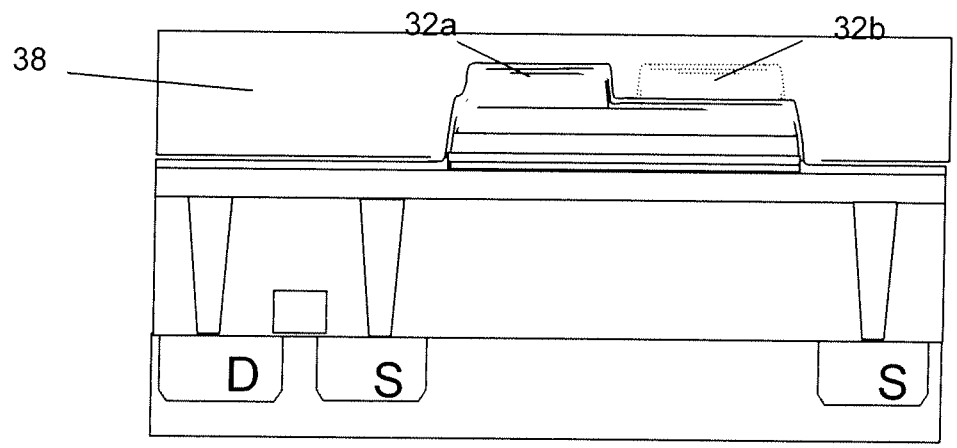

In FIG. 9, an insulator layer 38 is deposited on the layer 36. In embodiments, the insulator layer 38 may be, for example, TEOS or $SiO_2$, deposited using conventional deposition methods such as, for example, CVD or PVD. Once deposited, the insulator layer 38 can undergo a planarization process such as, for example, chemical mechanical polishing.

Figure 10:
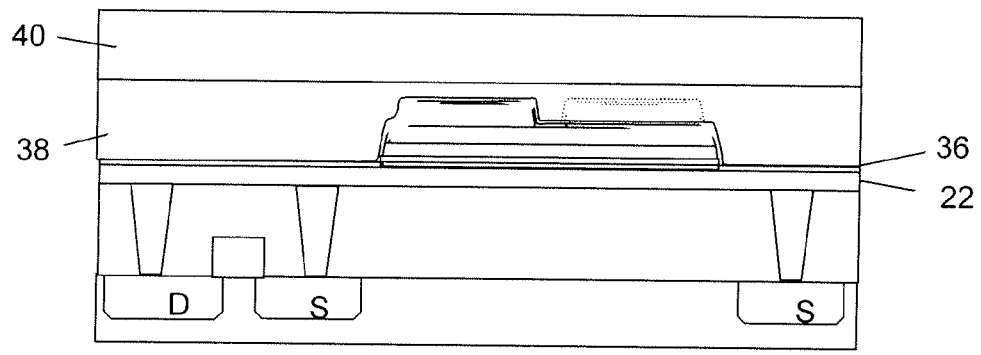

In FIG. 10, an insulator layer 40 is deposited on the insulator layer 38. In embodiments, the insulator layer 40 may be, for example, TEOS or $SiO_2$, deposited using conventional deposition methods such as, for example, CVD or PVD. Once deposited, the insulator layer 40 can undergo a planarization process such as, for example, chemical mechanical polishing.

Figure 11:
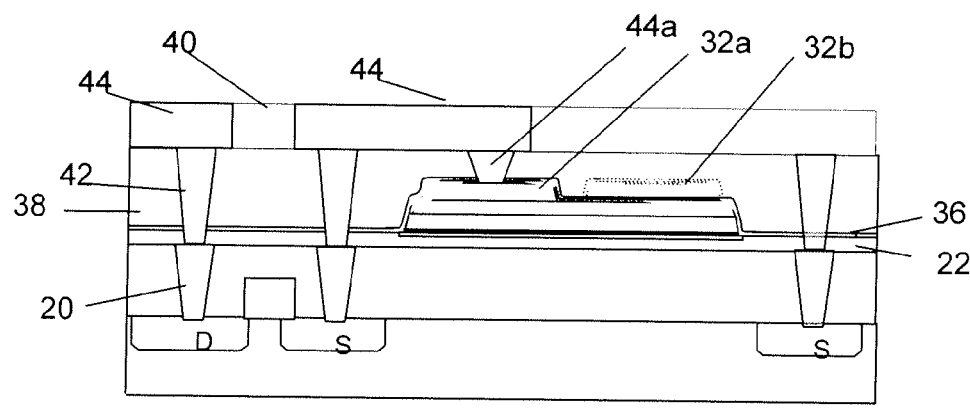

FIG. 11 represents damascene processes in accordance with the invention. In a first contemplated embodiment, a dual damascene process is used to fabricate contacts (studs) 42 and wiring 44, 44a. (It should be understood by those of skill in the art that wiring 44a may also be a contact to the top plate of the capacitor and, as such, contact and wiring are used interchangeable herein.) More specifically, in embodiments, a trench can be formed in the insulator layer 40 using conventional lithographic and etching processes (as discussed above). Vias are then formed in the insulator layer 38 using conventional lithographic and etching processes (as discussed above). The vias can extend through the layers 20 and 36, reaching to the contacts 20. In alternative embodiments, the vias can be formed prior to the formation of the trenches.

In embodiments, the vias are aligned with and extend to the contacts 20 and top plates 32a, 32b. (Although not shown in this view, the vias also extend to the bottom plate.) The vias can be, for example, about 0.6 to 0.2 microns in diameter, or smaller (which may be applicable to all aspects of the invention). The vias that extend to the contacts 20 are filled with metal using conventional metal deposition processes to form contacts 42. In embodiments, the metal is tungsten; although other metals or metal alloys are contemplated by the present invention such as, for example, copper. The remaining vias can be masked during this metal deposition process. The trenches and remaining vias are filled with metal to form wiring 44, 44a, which contact the contacts 42 and top plates 32a, 32b. In embodiments, the wiring 44, 44a is copper; although other metals or metal alloys are contemplated by the present invention. In embodiments, a seed layer and/or liner can be deposited into the trenches and/or vias prior to the metal deposition. The use of the seed layer and/or liner may be applicable to all aspects of the invention.

In an alternative embodiment, the contacts 42 and wiring 44, 44a can be formed using a single damascene process. In this process, vias extending to the contacts 20 are formed in the insulator layer 38, prior to the deposition of the insulator layer 40. The vias can be formed using conventional lithographic and etching processes (as discussed above). The vias are in alignment with and extend to the contacts 20 and can be, for example, about 0.6 to 0.2 microns in diameter, or smaller. The vias that extend to the contacts 20 are filled with tungsten (or other metal or metal alloy) using conventional metal deposition processes to form contacts 42. In embodiments, additional vias are also formed, which extend to the top plates 32a, 32b. The additional vias can be formed in the same manner as discussed above, and can be filled with copper, for example, to form wiring 44a (in contact with the top plates 32a, 32b). After the vias are filled with metal, the insulator layer 40 is deposited using conventional deposition processes. The insulator layer may be etched to form trenches extending to the contacts 42 and wiring 44a. The trenches are then filled with copper (or other metal or metal alloy) to form wiring 44. Wiring 44 is in contact with the contacts 40 and wiring 44a. The structure can then undergo a planarization and/or polishing step using conventional methodologies known to those of skill in the art.

Figure 12:
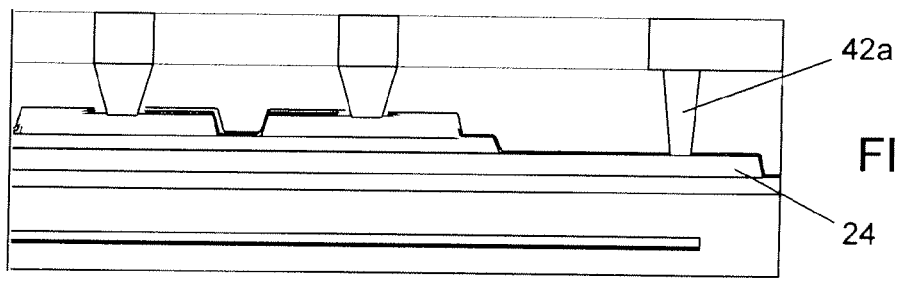
Figure 13:
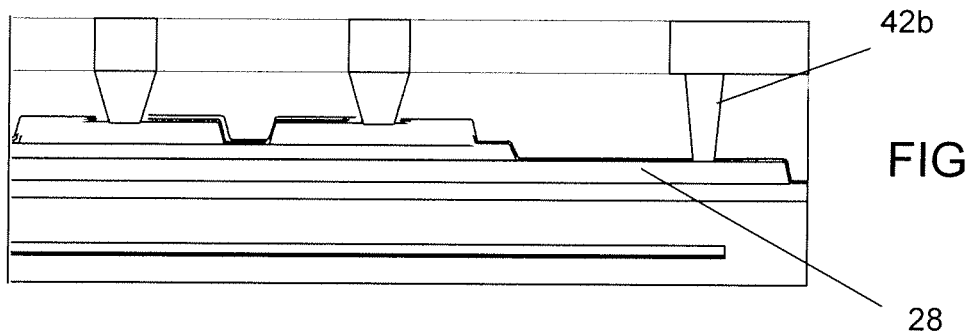
FIG. 13 shows an alternative structure and methods of fabricating a device in accordance with aspects of the invention.

FIG. 12 shows another perspective view of the structure shown in FIG. 11. In this view, contact 42a is in contact with the bottom plate 28 (which was patterned during the etching of layers 24, 26 and 28). The contact 42a is, in embodiments, tungsten. However, as shown in FIG. 13, the contact represented at reference numeral 42b, e.g., also referred to as wiring (depending on the technology node), can be copper or other metal or metal alloy. The contacts 42a, 42b can be formed at the same time as contacts 42, in the manner described above.

FIGS. 14-21 show structures and methods of fabricating a device in accordance with aspects of the invention. In the design of this aspect of the invention, the FRAM thermal cycle will only influence the CMOS, and will not affect the tungsten contacts.

Figure 14:
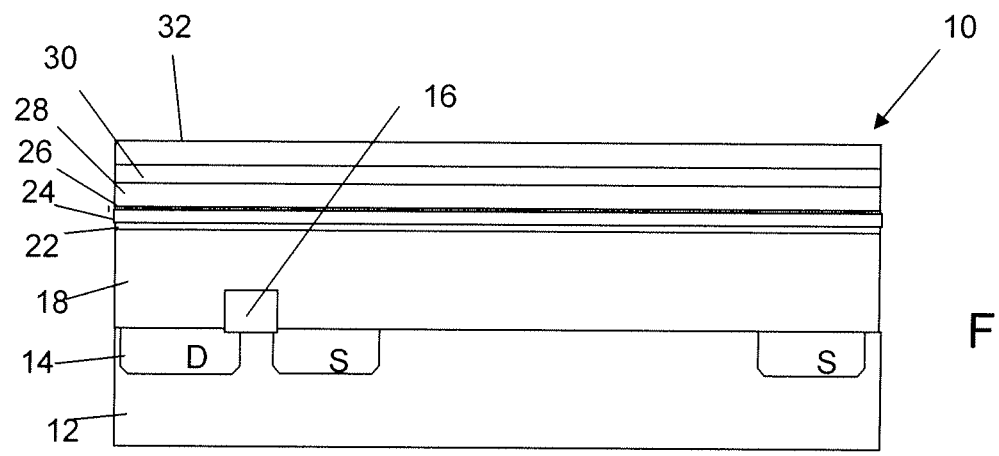
FIGS. 14-21 show alternate structures and methods of fabricating a device in accordance with aspects of the invention.

FIG. 14 starts with a conventional CMOS structure 10, with additional layers In particular, source (S) and drain (D) regions 14 are provided in a substrate 12 using conventional doping processes. The substrate 12 can be, for example, silicon. A conventional gate structure 16 is fabricated on the substrate 12 using conventional deposition, lithographic and etching processes. The gate structure 16 spans between the source (S) and drain (D) regions 14, and includes a gate insulator (e.g., dielectric), poly gate body and nitride or oxide sidewalls. In embodiments, the gate structure 16 can also include a capping layer such as, for example, a nitride or oxide cap. An insulator layer 18 is deposited on the substrate 12 and gate structure 16. In embodiments, the insulator layer 18 may be, for example, a BPSG.

Still referring to FIG. 14, an insulator layer 22 is deposited on the insulator layer 18. In embodiments, the insulator layer 22 is TEOS (Tetraethyl orthosilicate). The insulator layer 22 can be blanket deposited using, for example, conventional CVD or PVD processes, and can range in thickness from about 10 nm to about 1000 nm. An optional layer 24 of $Al_2O_3$ (AlxOy) is deposited on the insulator layer 22 using, for example, conventional CVD or PVD processes. The layer 24 may be blanket deposited to a depth of about 5 nm to about 50 nm. An optional TiOx layer 26 is blanket deposited on layer 24. The TiOx layer 26 may be deposited to a depth of about 5 nm to about 50 nm using, for example, conventional CVD or PVD processes.

A metal layer (e.g., platinum layer 28) is deposited on the optional TiOx layer 26 using, for example, conventional metal deposition processes. In embodiments, the platinum layer 28 acts as a bottom plate of a capacitor. The platinum layer 28 may be deposited to a thickness of about 50 nm to about 300 nm. In further embodiments, a PZT layer 30 (or other ferro-electric material) is deposited on the platinum layer 28 to a thickness of about 50 nm to about 400 nm, using conventional deposition processes. In embodiments, the PZT layer 30 can be heavily doped with Lanthanum, Strontium or Calcium, in the percent range. An Iridium Oxide (IrOx) layer 32 is blanket deposited on the PZT layer 30 to a thickness of about 50 nm to about 300 nm. In optional embodiments, the layer 32 may be capped with Ir or platinum to a thickness of about 20 nm to about 500 nm, and more particularly about 100 nm to about 200 nm and more particularly about 150 nm. The layer 32 will act as a top plate for the capacitor.

Figure 15:
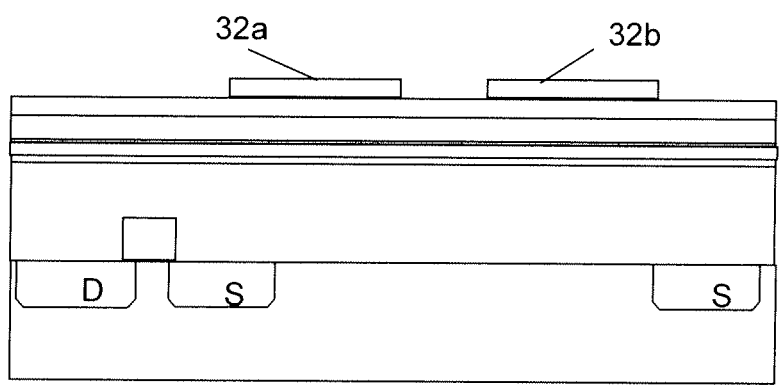

In FIG. 15, the layer 32 is patterned using conventional lithographic and etching processes. For example, a resist is deposited over the layer 32 and exposed to light to form openings. Once the openings are formed, a reactive ion etching process is performed to pattern the layer 32 to form patterns 32a and 32b. The resist is then stripped using, for example, an organic clean and rinse process. The shadowed pattern 32b (on the right of the figure) is a portion of the top plate (layer 32) that is set back with respect to the pattern 32a, in a direction perpendicular to the plane of the structure shown in FIG. 15.

Figure 16:
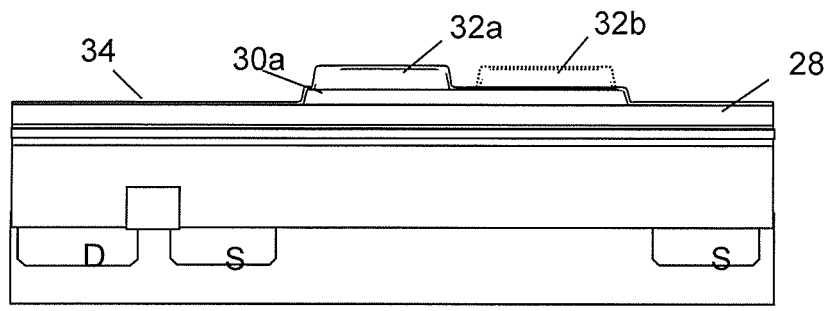

FIG. 16 shows an additional patterning process. In FIG. 16, the PZT layer 30 is patterned to form a pattern 30a. In embodiments, the pattern 30a is sandwiched between the top plate and bottom plate of the capacitor. In one example, the pattern 30a is formed by depositing a resist (e.g., PZT mask) over the layer 30 and patterns 32a and 32b. The resist will protect the patterns 32a and 32b (top plates) during subsequent etching processes. The resist is exposed to light to form opening(s) and, thereafter, a reactive ion etching (RIE) process is performed to pattern the layer 30 to form pattern 30a. The resist is then stripped using, for example, an organic clean and rinse process.

An optional layer 34 is deposited on the patterns 32a, 32b and 30a, and layer 28 using conventional deposition processes. In embodiments, the layer 34 is an optional AlOx, which encapsulates the patterns 32a, 32b and 30a. In this manner, the encapsulated patterns 32a, 32b and 30a will be protected from hydrogen poisoning during subsequent processing steps. The layer 28 can be deposited to a thickness of about 50 nm.

Figure 17:
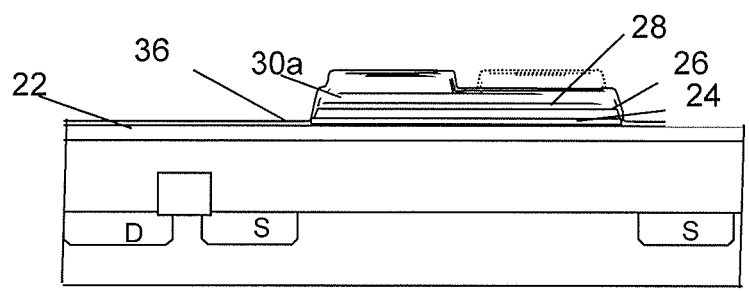

In FIG. 17, the layers 24, 26 and 28 are etched using conventional etching processes such as, for example, RIE. In embodiments, the etching will be selective to layers 24, 26 and 28, and will not significantly affect the underlying layer 22. The etching process can be performed, for example, by depositing a resist (mask) over the encapsulated patterns 32a, 32b and 30a (or optional layer 34 as shown in FIG. 16). The resist is then exposed to light to form opening(s). The structure then undergoes an etching process to remove unprotected portions of layers 24, 26 and 28 (or optional layer 34 as shown in FIG. 16). The structure of FIG. 17 then undergoes a conventional cleaning process.

In FIG. 17, the structure is then encapsulated by layer 36. More specifically, layer 36 is deposited on the encapsulated patterns 32a, 32b and 30a (or optional layer 34 as shown in FIG. 16), and on layer 22. The layer 36 may also be deposited on sidewalls and any exposed surfaces of layers 24, 26 and 28. In this manner, the layer 36 will protect or encapsulate the sidewalls and any exposed surfaces of layer 24, 26 and 28. The layer 36 can be, for example, AlOx, deposited to a thickness of about 50 nm or less.

Figure 18:
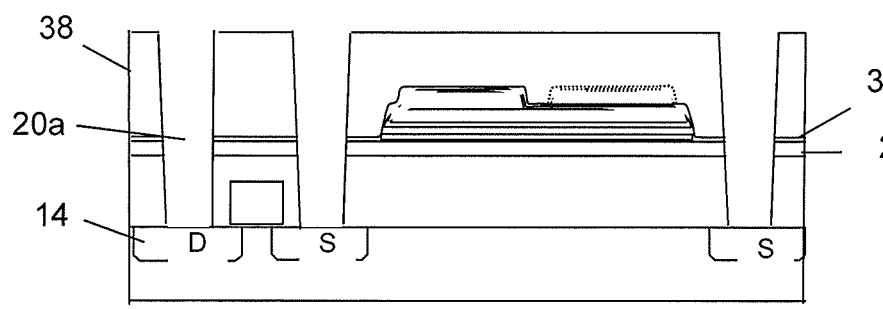

In FIG. 18, an insulator layer 38 is deposited on the layer 36. In embodiments, the insulator layer 38 may be, for example, TEOS or $SiO_2$, deposited using conventional deposition methods such as, for example, CVD or PVD. Once deposited, the insulator layer 38 can undergo a planarization process such as, for example, chemical mechanical polishing. Contact vias 20a are formed in the insulator layer 18 and insulator layer 38 (and through any additional layers such as, for example, layers 22 and 36). The contact holes can be formed using a conventional lithographic and etching process (e.g., reactive ion etching), extending to the source (S) and drain (D) regions 14.

Figure 19:
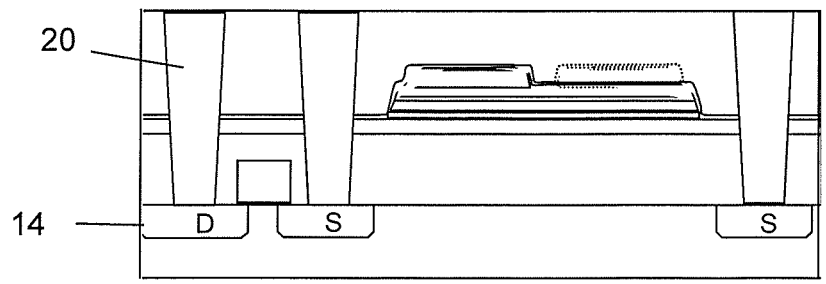

As shown in FIG. 19, a metal is deposited in the contact holes 20a to form the contacts 20 (which contact the source and drain regions). In embodiments, the metal is tungsten; although other metals or metal alloys are also contemplated by the present invention. In embodiments, the metal deposition process may include lining the contact holes with a barrier layer such as, for example, TiN or TiAlN, prior to the metal (e.g., tungsten) deposition. After the metal deposition, the structure undergoes a polishing using, for example, conventional polishing steps such as chemical mechanical polishing (CMP).

Figure 20:
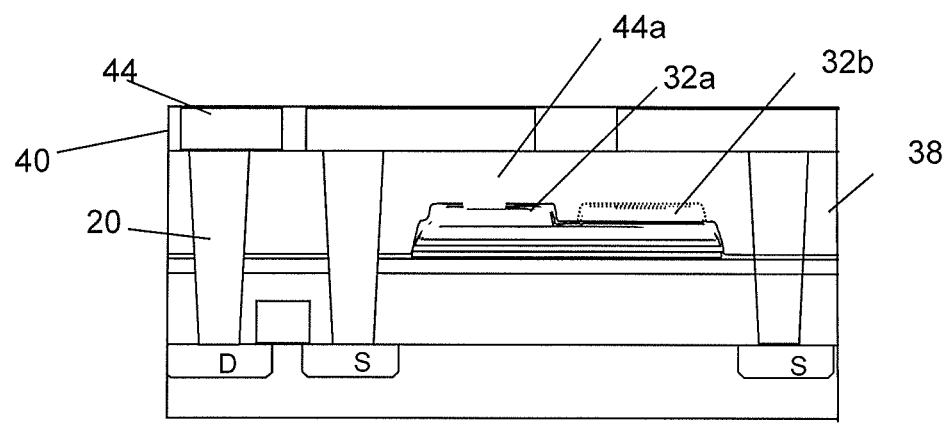

In FIG. 20, an insulator layer 40 is deposited on the insulator layer 38. In embodiments, the insulator layer 40 may be, for example, TEOS or $SiO_2$, deposited using conventional deposition methods such as, for example, CVD or PVD. Once deposited, the insulator layer 40 can undergo a planarization process such as, for example, chemical mechanical polishing.

A dual damascene process is then used to fabricate wiring 44, 44a. More specifically, in embodiments, a trench can be formed in the insulator layer 40 using conventional lithographic and etching processes (as discussed above). Vias are then formed in the insulator layer 38 using conventional lithographic and etching processes (as discussed above). In alternative embodiments, the vias can be formed prior to the formation of the trenches. In embodiments, the trenches are aligned with and extend to the contacts 20, whereas, the vias are aligned with and extend the top plates 32a, 32b. (Although not shown in this view, the vias also extend to the bottom plate.) The vias can be, for example, about 0.6 to 0.2 microns in diameter, or smaller. The trenches and vias are filled with copper (or other metal or metal alloy) to form wiring 44, 44a, which contact with the contacts 20 and top plates 32a, 32b.

In an alternative embodiment, the wiring 44, 44a can be formed using a single damascene process. In this process, vias extending to the top plates 32a, 32b are formed in the insulator layer 38, prior to the deposition of the insulator layer 40. The vias can be formed using conventional lithographic and etching processes (as discussed above), before, during or after the formation of the contact holes 20a. The vias that extend to the top plates 32a, 32b can be filled with copper, for example, to form wiring 44a (in contact with the top plates 32a, 32b). After the vias are filled, the insulator layer 40 is deposited and etched to form trenches. The trenches are then filled with copper (or other metal or metal alloy) to form wiring 44, which contact the contacts 20 and wiring 44a.

Figure 21:
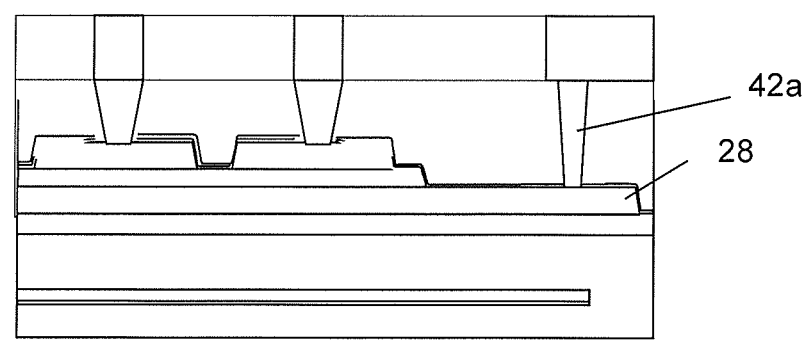

FIG. 21 shows another perspective view of the structure shown in FIG. 20. In FIG. 20, contact 42a is formed in contact with the bottom plate 28. This contact 42a is, in embodiments, tungsten or copper. The contact 42a can be formed at the same time as contacts 42, in the manner described above.

Figure 22:
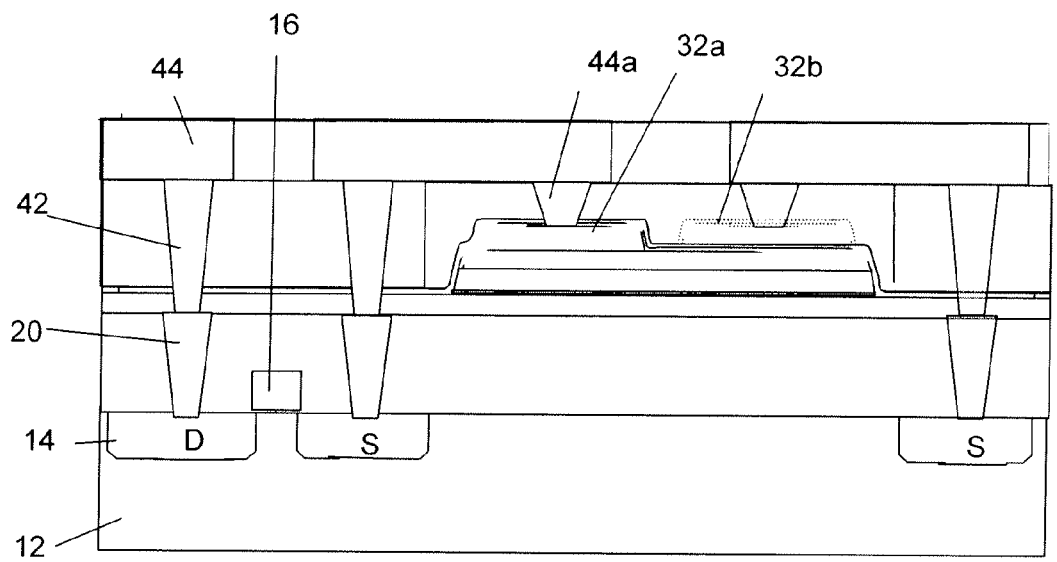
FIGS. 22 and 23 show an alternate structure and methods of fabricating a device in accordance with aspects of the invention.
Figure 23:
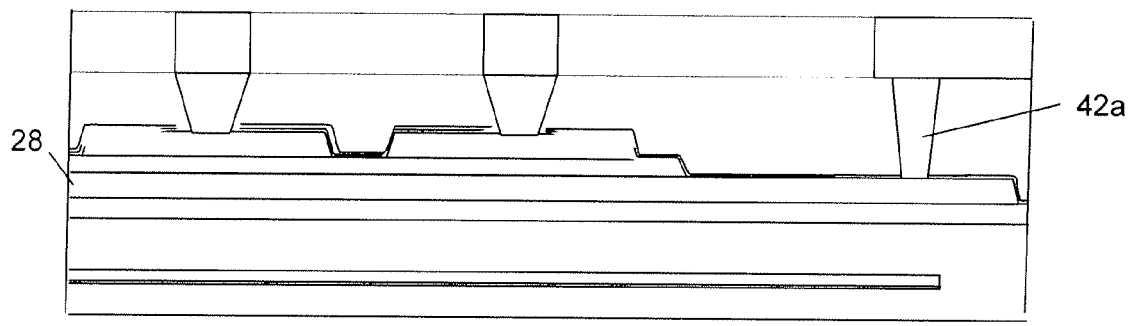

FIGS. 22 and 23 show a structure and methods of fabricating the structure (device) in accordance with aspects of the invention. In the design of this aspect of the invention, the structure has a reduced contact aspect ratio to silicon, and the method of fabrication eliminates hydrogen exposure of the top electrode contact (which may be applicable to all aspects of the invention). In the embodiment of FIGS. 22 and 23, the wiring 44, 44a is copper and the contacts 20 are tungsten. In alternative embodiments, the metal wiring 44 is a different material than the metal contact 20. FIG. 23 shows a copper contact 42a in contact with the bottom plate 28. In embodiments, the contact 42a and wiring 44 are fabricated using a same material. The structure of FIGS. 22 and 23 can be fabricated using the steps discussed above.

Figure 24:
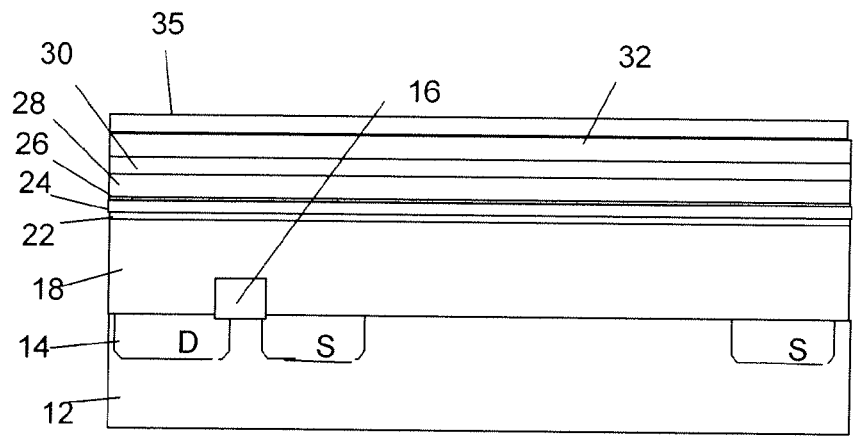
FIGS. 24-27 show alternate structures and methods of fabricating a device in accordance with aspects of the invention.

FIGS. 24-27 show structures and methods of fabricating a device in accordance with aspects of the invention. FIG. 24 starts with a conventional CMOS, with additional layers. Specifically, the structure of FIG. 24 includes the layers 22, 24, 26, 28 and 32 as discussed with reference to FIG. 14. In addition, the structure of FIG. 24 includes layer 35. Layer 35 may be, for example, a TiN or TiAlN layer deposited on the layer 32.

Figure 25:
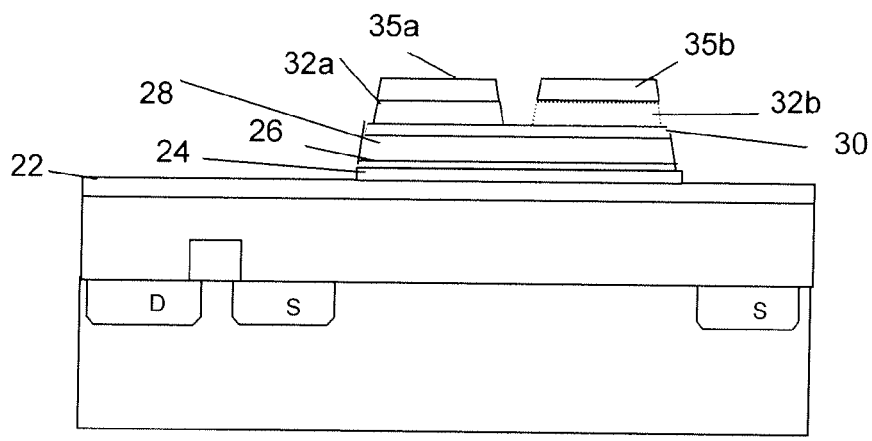

FIG. 25 represents several lithographic and etching steps in accordance with the invention. In particular, as discussed in detail above, the layer 32 is etched to form patterns 32a, 32b. Similarly, layer 35 is etched to form patterns 35a and 35b. In embodiments, the patterns 30a, 30b, 35a, 35b are formed simultaneously (and in substantially the same basic pattern) using conventional lithographic and etching processes. Layer 30 is also patterned to form pattern 30a, using conventional lithographic and etching processes. Additionally, layers 24, 26 and 28 are patterned using conventional lithographic and etching steps, as discussed above. In embodiments, the structure of FIG. 25 does not include the optional encapsulating layer 34, i.e., layer 34 is not deposited on the structure after the patterning of patterning.

Figure 26:
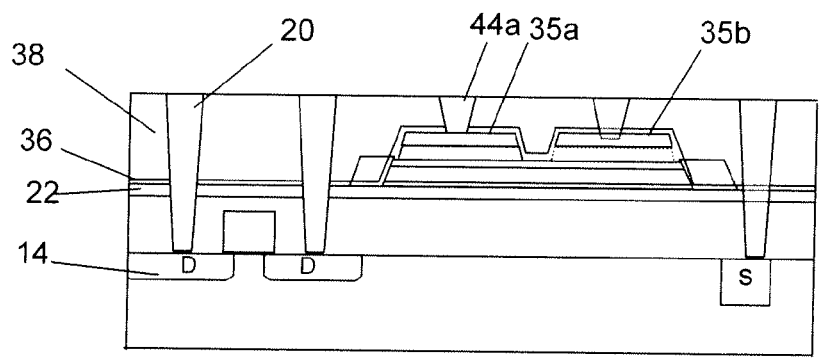

As shown in FIG. 26, an encapsulating layer 36 is blanket deposited on the structure of FIG. 25. More specifically, the encapsulating layer 36 is deposited on the sidewalls and exposed surfaces of layers 22, 24, 26, 28, 30a, 30b, 32a, 35a, 35b. The encapsulating layer 36 is, in embodiments, $Al_2O_3$ (AlxOy). Thereafter, an insulator layer 38 is deposited on the encapsulating layer 36. The insulator layer 38 may be, for example, TEOS or $SiO_2$. Contact holes are formed in the insulator layer 38 above the patterns 23a, 32b, 35a, 35b. Metal, such as, for example, tungsten is deposited in the contact holes to form wiring 44a. Contact holes are also formed in the insulator layer 38, as well as layers 36 and 22 above the source and drain regions 14. Metal, such as, for example, tungsten is deposited in the contact holes to form contacts 20. In embodiments, the contact holes and deposition of metal for forming the contacts 20 and wiring 44a can be fabricated simultaneously using, for example, single damascene processes.

Figure 27:
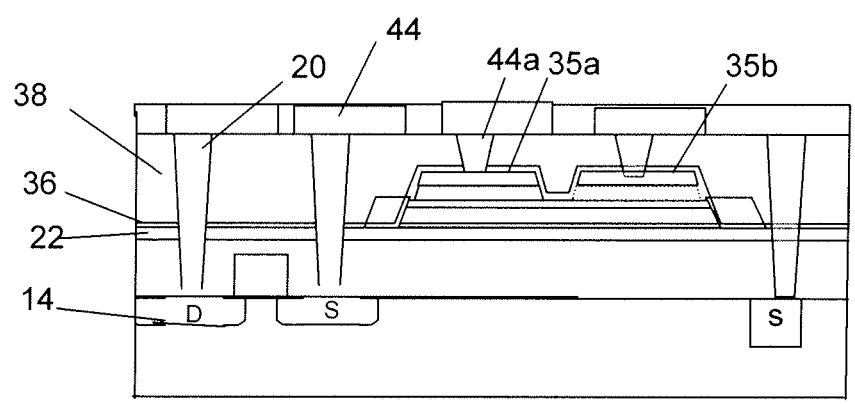

FIG. 27 shows the formation of the wiring 44. As discussed above, the wiring can be formed by depositing an insulator layer 40 on the insulator layer 38. A trench can be formed in the insulator layer, in alignment with the wiring 44a and contacts 20. A metal can be deposited in the trench to form the wiring 44. In embodiments, the wiring is copper; although other metal or metal alloys are contemplated by the invention. As should now be appreciated by those of skill in the art, any combination of copper and/or tungsten can be used for the wiring 44, 44a and contacts 20, 42, using the integration schemes discussed herein.

DESIGN STRUCTURE

Figure 28:
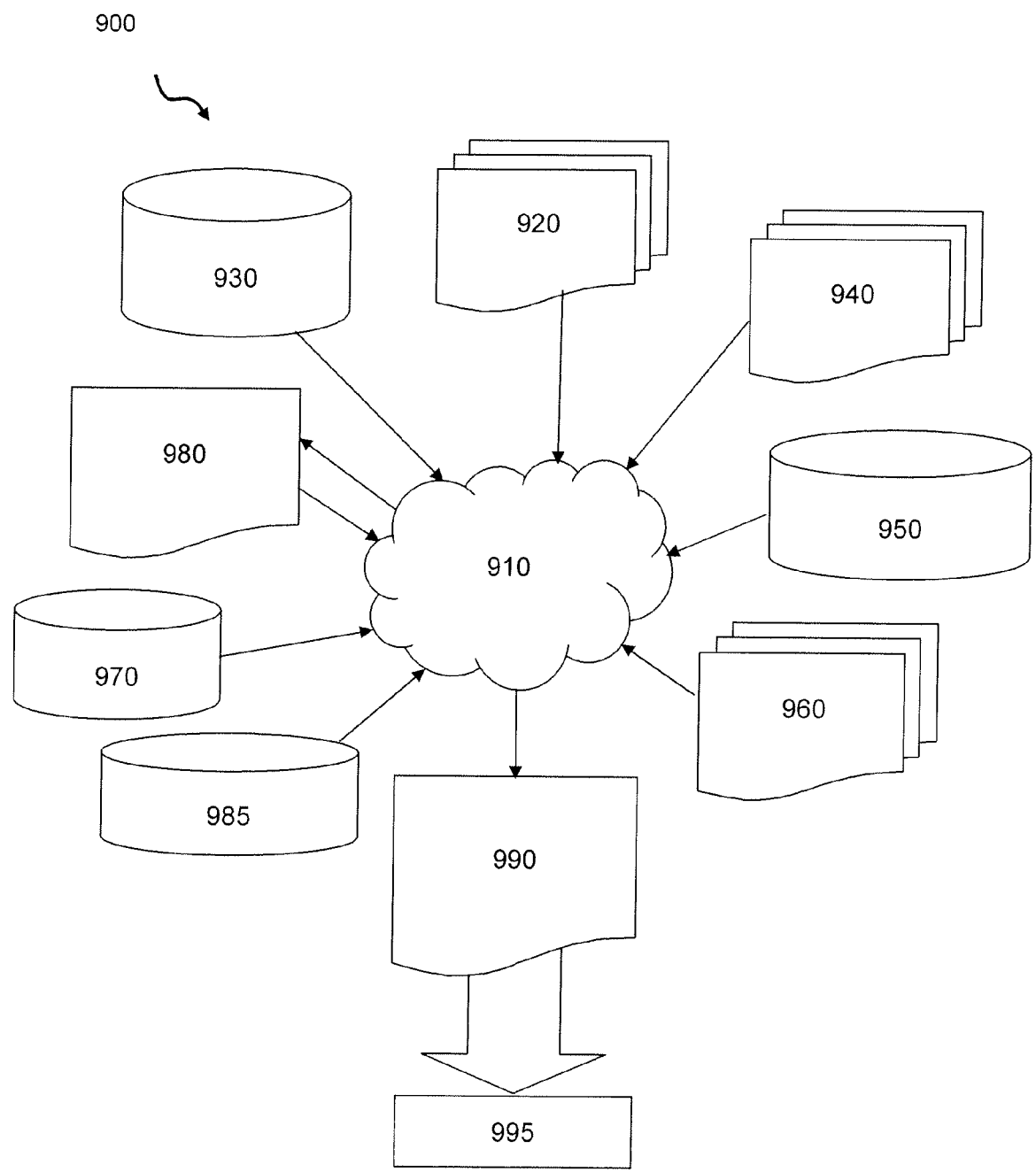
FIG. 28 shows a flow diagram of a design process used in semiconductor design, manufacture, and/or test.

FIG. 28 illustrates multiple design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-27. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-27 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and design attributes for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-27. In one embodiment, design structure 990 may comprise a compiled, executable HDL simulation model that functionally simulates the devices shown in FIGS. 1-27.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout design attributes, wires, levels of metal, vias, shapes, data for routing through the manufacturing line, and any other data required by a manufacturer or other designer/developer to produce a device or structure as described above and shown in FIGS. 1-27. Design structure 990 may then proceed to a stage 995 where, for example, design structure 990: proceeds to tape-out, is released to manufacturing, is released to a mask house, is sent to another design house, is sent back to the customer, etc.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed:

1. A method, comprising:
   forming a barrier layer on an insulator layer of a CMOS structure;
   forming a top plate and a bottom plate over the barrier layer;
   forming a ferro-electric material between the top plate and the bottom plate;
   forming a first encapsulating layer over the top plate, the bottom plate, and the ferro-electric material;
   etching a portion of the first encapsulating layer and a portion of the bottom plate;
   forming a second encapsulating layer on the first encapsulating layer and any exposed surfaces of the barrier layer and the bottom plate that become exposed when the first encapsulating layer is etched; and
   forming at least one first contact to the top plate through the first encapsulating layer and the second encapsulating layer and at least one second contact to the bottom plate through the second encapsulating layer,
   wherein at least the first contact to the top plate and a third contact to the CMOS structure are in electrical connection through a common wire; and
   the at least one first contact to the top plate is a first metal and the third contact to the CMOS structure is a second metal, different from the first metal.

2. The method of claim 1, wherein the first encapsulating layer is $Al_xO_y$.

3. The method of claim 1, further comprising patterning the top plate and the ferro-electric material, wherein the first encapsulating layer is formed after the top plate and the ferro-electric material are patterned.

4. The method of claim 1, wherein the at least one second contact is tungsten deposited in a single via formed in an insulator material.

5. The method of claim 1, wherein:
   the third contact is deposited in two separately formed vias;
   the second metal is tungsten;
   a first of the separately formed vias is etched in a lower insulator layer extending to a source and drain contact of a transistor; and
   a second of the separately formed vias is etched in an upper insulator layer deposited on the lower insulator layer, and extends to the first of the separately formed vias.

6. A method, comprising:
   forming a barrier layer on an insulator layer of a CMOS structure;
   forming a top plate and a bottom plate over the barrier layer;
   forming a ferro-electric material between the top plate and the bottom plate;
   encapsulating the barrier layer, the top plate, the bottom plate and the ferro-electric material with an encapsulating material; and forming contacts to the top plate and the bottom plate through the encapsulating material,
wherein:
at least the contact to the top plate and a contact to a diffusion of the CMOS structure are in electrical connection through a common wire;
the encapsulating material is AlxOy;
the encapsulating material is two layers;
a first encapsulating layer of the two layers is deposited on exposed surfaces of the top plate, the bottom plate, and the ferro-electric material;
the first encapsulating layer of the two layers is etched over portions of the ferro-electric material;
a second encapsulating layer of the two layers is deposited on the first encapsulating layer and any exposed surfaces of the bottom plate, the ferro-electric material, and an underlying insulator layer that become exposed when the first encapsulating layer is etched;
the etching of the first encapsulating layer etches portions of the ferro-electric material to expose sidewalls of the barrier layer and the bottom plate; and
the second encapsulating layer is deposited on the exposed sidewalls of the barrier layer and the bottom plate.

7. The method of claim 6, further comprising:
forming a first insulator layer on the second encapsulating layer;
forming a second insulator layer on the first insulator layer; and
performing a damascene process to form the contacts to the top plate and the bottom plate.

8. The method of claim 7, wherein the damascene process is a dual damascene process comprising:
etching a via in the first insulator layer and depositing metal therein to form the contacts;
etching a trench in the second insulator layer, deposited over the first insulator layer, the trench being filled with metal to form wiring in contact with the top plate and the bottom plate.

9. The method of claim 7, wherein the damascene process is single damascene processes which form contacts to source and drain regions of the CMOS structure.

10. A method, comprising:
forming a barrier layer on an insulator layer of a CMOS structure;
forming a top plate and a bottom plate over the barrier layer;
forming a ferro-electric material between the top plate and the bottom plate;
encapsulating the barrier layer, the top plate, the bottom plate and the ferro-electric material with an encapsulating material; and
forming contacts to the top plate and bottom plate, through the encapsulating material,
wherein:
at least the contact to the top plate and a contact to a diffusion of the CMOS structure are in electrical connection through a common wire;
the contact to the diffusion of the CMOS structure is tungsten deposited in two separately formed vias;
a first of the separately formed vias is etched in a lower insulator layer extending to a source and drain contact of a transistor;
a second of the separately formed vias is etched in an upper insulator layer deposited over the lower insulator layer, and extends to the first of the separately formed vias; and
the contacts are a first metal and wiring extending to the top plate and the bottom plate and in contact with the contacts is a second metal, different from the first metal.

11. A method of manufacturing a ferro-electric random access memory (FRAM), comprising:
forming a CMOS structure comprising a gate structure, source and drain regions associated with the gate structure and insulator material over the gate structure;
depositing a plurality of layers on the insulator material, the plurality of layers including at least a ferro-electric material sandwiched between a top plate and a bottom plate;
encapsulating the plurality of layers in an encapsulating material; and
forming contacts to the top plate and the bottom plate,
wherein:
at least the contact to the top plate and a contact to the source of the CMOS structure are in electrical connection through a common wire:
the contact to the top plate is a first metal and the contact to the source is a second metal, different from the first metal;
the plurality of layers further include a barrier layer formed on the top plate; and
the encapsulating material is a single encapsulating material.

12. The method of claim 11, further comprising:
patterning the plurality of layers; and
depositing the encapsulating material on the patterned plurality of layers.

13. The method of claim 11, wherein the contacts are formed using one of a dual damascene or multiple single damascene processes.

14. A method of manufacturing a ferro-electric random access memory (FRAM), comprising:
forming a CMOS structure comprising a gate structure, source and drain regions associated with the gate structure and insulator material over the gate structure;
depositing a plurality of layers on the insulator material, the plurality of layers including at least a ferro-electric material sandwiched between a top plate and a bottom plate;
encapsulating the plurality of layers in an encapsulating material; and
forming contacts to the top plate and the bottom plate,
wherein:
at least the contact to the top plate and a contact to the source of the CMOS structure are in electrical connection through a common wire;
the contact to the top plate is a first metal and the contact to the source is a second metal, different from the first metal; and
the plurality of layers further include a first barrier layer formed under the bottom plate and a second barrier layer formed on top of the top plate.

15. The method of claim 14, further comprising:
patterning the top plate and the second barrier layer in a single etching step;
patterning the bottom plate and the ferro-electric material in a single etching step; and
depositing the encapsulating material in a single deposition step over any exposed portions of the patterned second barrier layer, the top plate, the ferro-electric material and the bottom plate.

* * * * *